(12) United States Patent
Tsai et al.

(10) Patent No.: US 11,133,222 B2
(45) Date of Patent: Sep. 28, 2021

(54) METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventors: Chun Hsiung Tsai, Hsinchu County (TW); Cheng-Yi Peng, Taipei (TW); Ching-Hua Lee, Hsinchu (TW); Clement Hsingjen Wann, Carmel, NY (US); Yu-Ming Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/404,482

(22) Filed: May 6, 2019

(65) Prior Publication Data
US 2020/0135586 A1    Apr. 30, 2020

Related U.S. Application Data

(60) Provisional application No. 62/751,126, filed on Oct. 26, 2018.

(51) Int. Cl.
*H01L 21/8238* (2006.01)
*H01L 21/268* (2006.01)
(Continued)

(52) U.S. Cl.
CPC ........... *H01L 21/823814* (2013.01); *H01L 21/02532* (2013.01); *H01L 21/02592* (2013.01); *H01L 21/02675* (2013.01); *H01L 21/268* (2013.01); *H01L 21/26506* (2013.01); *H01L 21/26513* (2013.01); *H01L 21/31116* (2013.01); *H01L 21/823821* (2013.01); *H01L 29/401* (2013.01); *H01L 29/45* (2013.01); *H01L 29/665* (2013.01)

(58) Field of Classification Search
CPC combination set(s) only.
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| (Continued) | | | |

*Primary Examiner* — Ratisha Mehta
(74) *Attorney, Agent, or Firm* — WPAT, P.C.; Anthony King

(57) ABSTRACT

Methods of manufacturing a semiconductor structure are provided. One of the methods includes the following operations. A substrate is received, and the substrate includes a first transistor with a first conductive region and a second transistor with a second conductive region, wherein the first transistor and the second transistor have different conductive types. A first laser anneal is performed on the first conductive region to repair lattice damage. An amorphization is performed on the first conductive region and the second conductive region to enhance silicide formation to a desired phase transformation in the subsequent operations. A pre-silicide layer is formed on the substrate after the amorphization. A thermal anneal is performed to the substrate to form a silicide layer from the pre-silicide layer. A second laser anneal is performed on the first conductive region and the second conductive region after the formation of the pre-silicide layer.

20 Claims, 14 Drawing Sheets

M10

(51) Int. Cl.
*H01L 29/66* (2006.01)
*H01L 21/265* (2006.01)
*H01L 21/311* (2006.01)
*H01L 29/40* (2006.01)
*H01L 21/02* (2006.01)
*H01L 29/45* (2006.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2012/0070971 A1* | 3/2012 | Yeong ............ H01L 21/823864 438/558 |
| 2015/0364571 A1* | 12/2015 | Breil ................ H01L 21/28518 257/384 |
| 2016/0079420 A1* | 3/2016 | Liu ..................... H01L 21/265 257/369 |

\* cited by examiner

METHOD FOR MANUFACTURING SEMICONDUCTOR STRUCTURE

PRIORITY CLAIM AND CROSS-REFERENCE

This application claims the benefit of provisional application No. 62/751,126, filed on Oct. 26, 2018, entitled "A method for manufacturing a semiconductor structure," the disclosure of which is hereby incorporated by reference in its entirety.

BACKGROUND

The semiconductor integrated circuit (IC) industry has experienced rapid growth. Technological advances in design and IC materials have created successive IC generations each with smaller and more complex circuits than the previous generation. A complex and reduced-sized IC structure is susceptible to defects or physical damage, and small changes in electrical properties of electrical components in the IC structure can result in low performance of the IC structure. For instance, an electrical resistance of the sources and drains in the IC structures can dramatically influence performance of the IC structure. However, even a minor change in a semiconductor manufacturing process is difficult due to high complexities of the manufacturing process and inter-dependent factors influencing different elements and layers of a semiconductor structure.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
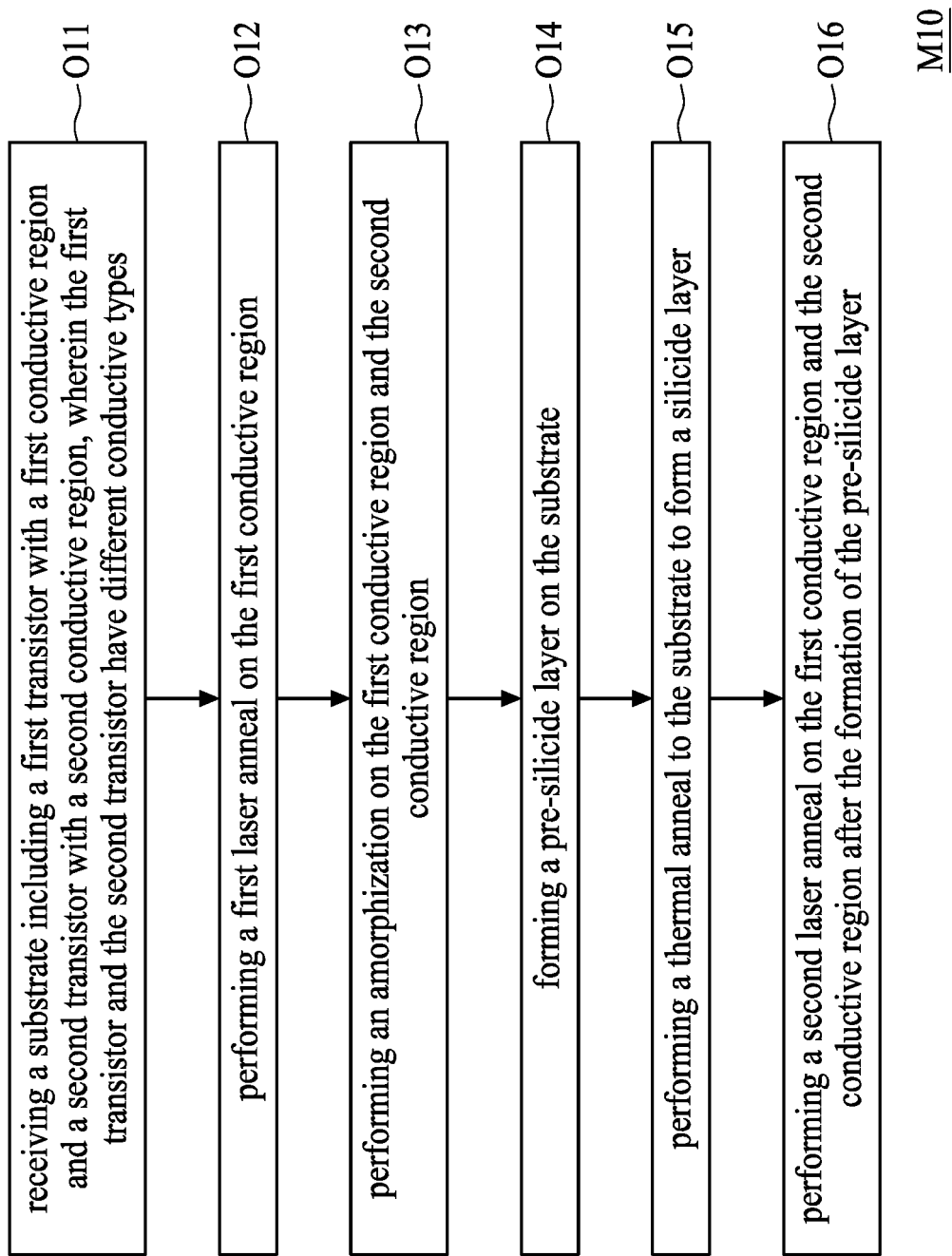
FIG. 1 is a flowchart of a method for manufacturing a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

FIG. 1 illustrates a method M10 for manufacturing a semiconductor structure W10 in accordance with some embodiments of the present disclosure. The method M10 includes: (O11) receiving a substrate including a first transistor with a first conductive region and a second transistor with a second conductive region, wherein the first transistor and the second transistor have different conductive types; (O12) performing a first laser anneal on the first conductive region; (O13) performing an amorphization on the first conductive region and the second conductive region; (O14) forming a pre-silicide layer on the substrate; (O15) performing a thermal anneal to the substrate to form a silicide layer; and (O16) performing a second laser anneal on the first conductive region and the second conductive region after the formation of the pre-silicide layer. It should be noted that the sequence of operations (O11 to O16) as shown in FIG. 1 illustrates merely a spirit of the present disclosure but is not intended to limit a manufacturing sequence of the operations (O11 to O16).

In order to further illustrate concepts of the present disclosure, various embodiments are provided below. However, it is not intended to limit the present disclosure to specific embodiments. In addition, conditions or parameters illustrated in different embodiments can be combined or modified to have different combinations of embodiments as long as the parameters or conditions used are not conflicted.

Figure 2:
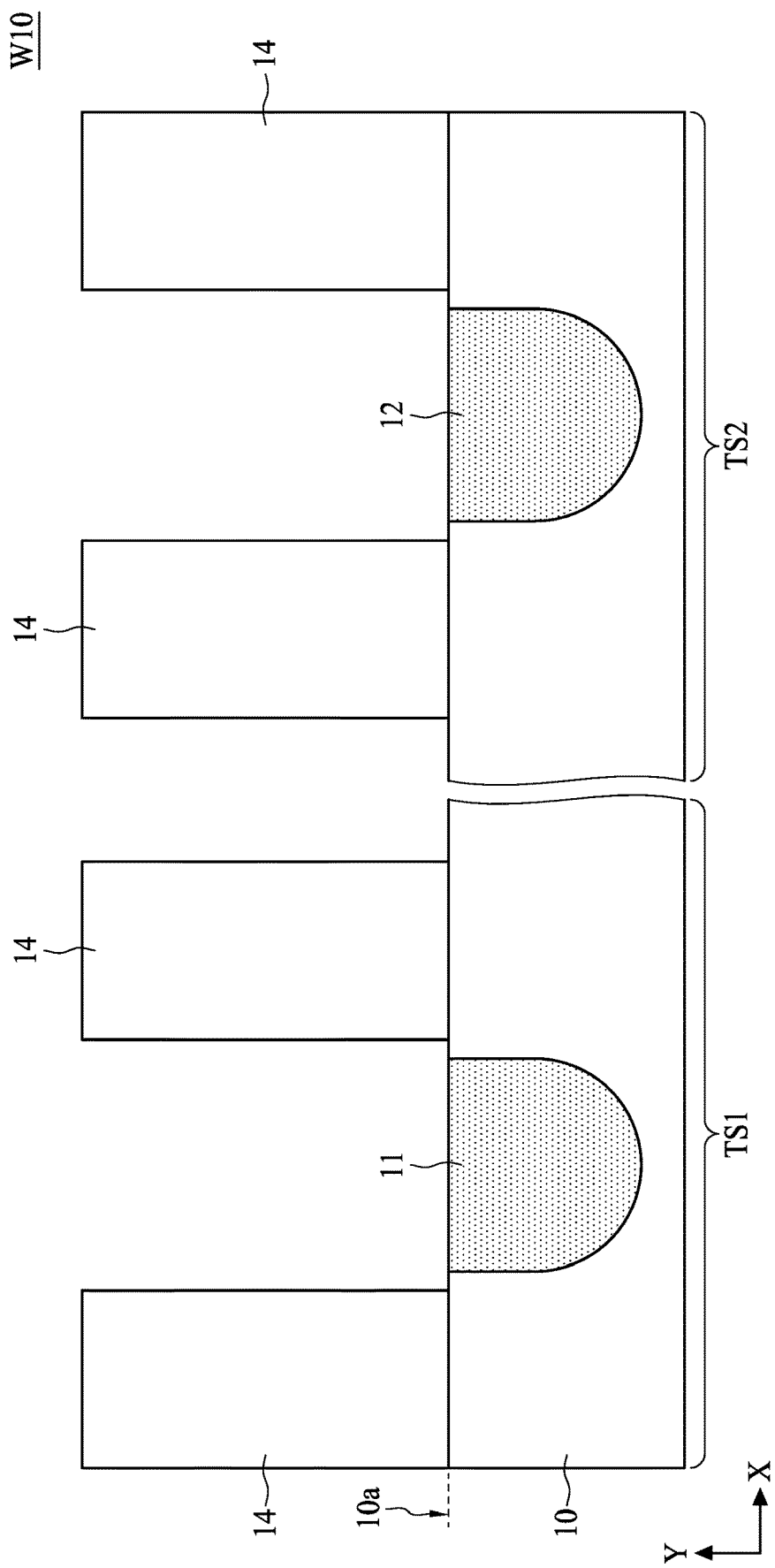
FIGS. 2 to 11 are cross-sectional views of a semiconductor structure during various stages of manufacturing in accordance with some embodiments of the present disclosure.

Referring to FIG. 2, in accordance with the operation O11 and some embodiments of the present disclosure, a substrate 10 is received or provided. The substrate 10 includes a first transistor TS1 and a second transistor TS2. The first transistor TS1 and the second transistor TS2 have different conductive types. The first transistor TS1 and the second transistor TS2 individually can represent a group of transistors having the same conductive type; however, for ease of illustration, only a portion of the first transistor TS1 and a portion of the second transistor TS2 are shown in FIGS. 2 to 11. A singular first transistor TS1 and a singular second transistor TS2 are used in the flowing description.

Figure 14:
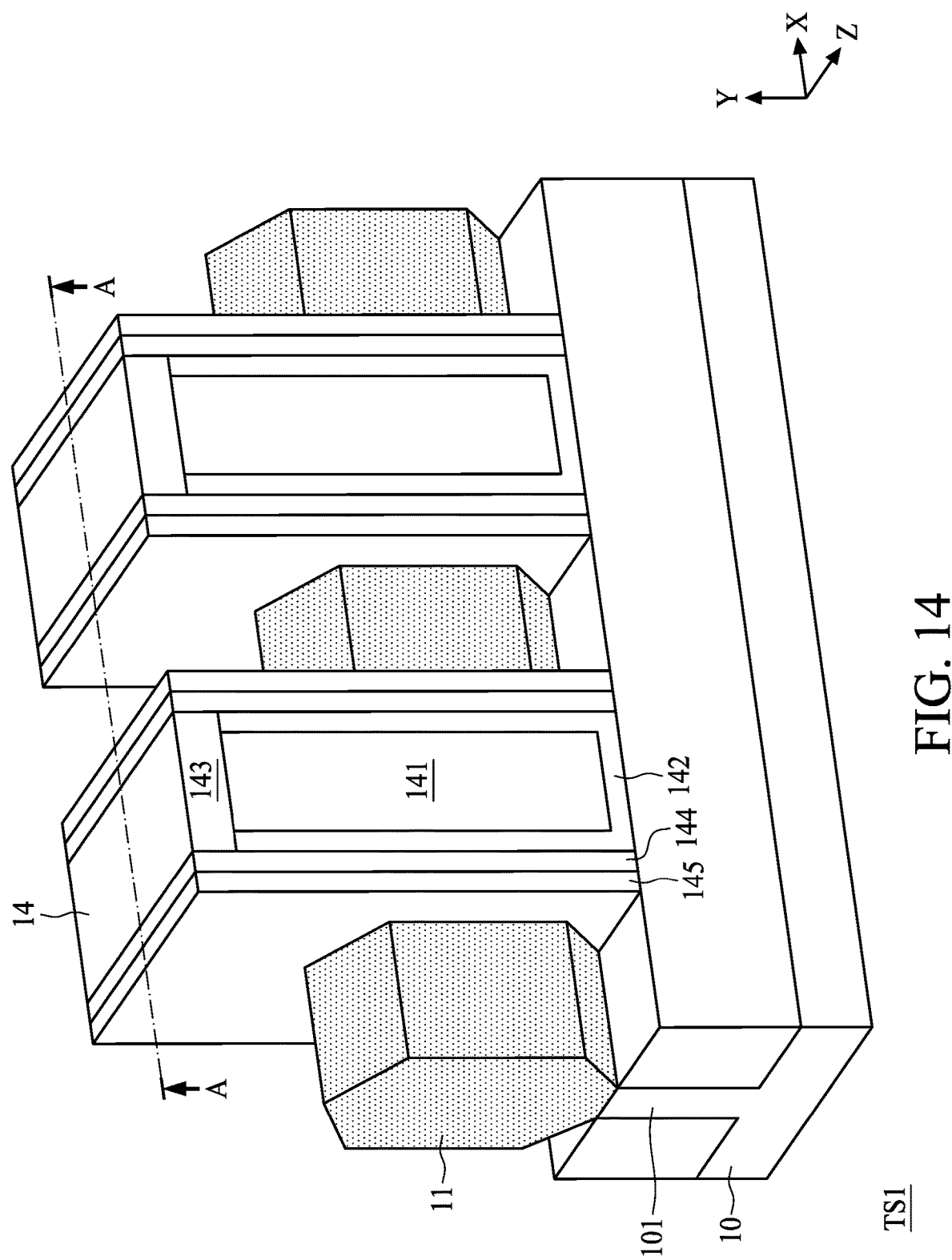
FIG. 14 is a three-dimensional diagram of one or more transistors in accordance with some embodiments of the present disclosure.

In some embodiments, the first transistor TS1 is a PMOS (P-type metal oxide semiconductor) transistor, and the second transistor TS2 is an NMOS (N-type metal oxide semiconductor) transistor. In some embodiments, the first transistor TS1 is an NMOS transistor and the second transistor TS2 is a PMOS transistor. For ease of understanding and illustration, the embodiments including the first transistor TS1 as a PMOS and the second transistor TS2 as an NMOS are used in the following description. The first transistor TS1 includes a first conductive region 11 formed in the substrate 10, and the second transistor TS2 includes a second conductive region 12 formed in the substrate 10. In some embodiments the first transistor TS1 and the second transistor TS2 being fin field effect transistors (FinFETs), the first conductive region 11 and the second conductive region 12 are formed in a fin structure 101 of the substrate 10 as shown in FIG. 14, wherein FIG. 14 shows merely a portion of the first transistor TS1 for a purpose of ease of illustration. A cross-sectional perspective of the first transistor TS1 a long a line A-A' shown in FIG. 14 is similar to the cross-sectional diagram of the first transistor TS1 shown in FIG. 2. A three dimensional diagram of the second transistor TS1 can be similar to the first transistor TS1 shown in FIG. 2, and a repeat figures is omitted. In some embodiments, the first and second conductive regions 11 and 12 are formed by epitaxial growth, and the first and second conductive regions 11 and 12 at this stage are entirely crystalline. Configurations of the first conductive region 11 and/or the second conductive region 12 depend on different epitaxial techniques, and it is not limited herein. In some embodiments, the first and second conductive regions 11 and 12 can include germanium (Ge), silicon germanium (SiGe), silicon carbide (SiC), silicon phosphorus (SiP), silicon germanium carbon (SiGeC), silicon carbon phosphorus (SiCP) or other suitable materials.

A plurality of gate structures 14 are formed over the substrate 10 adjacent to the first conductive region 11 and the second conductive region 12, and on a first surface 10a of the substrate 10. In some embodiments, the plurality of gate structures 14 is formed over and across the fin structure of the substrate 10. In some embodiments, the gate structures 14 are formed after the formation of the fin structure and prior to the formation of the first and second conductive regions 11 and 12. In some embodiments as shown in FIG. 14, the gate structures 14 are extended across and over and perpendicular to the fin structure 101 (e.g. in the embodiments, the fin structure 101 of the substrate 10 is extended along the X direction, and the gate structures are extended along the Z direction). In some embodiments, the gate structures 14 are polysilicon gate structures. In some embodiments, the gate structures 14 are metal gate structures. A type of the gate structures 14 is not limited herein. In some embodiments, each of the gate structures 14 includes a gate electrode 141, a gate dielectric 142, a hard mask 143, a pair of spacers 144, and a dielectric material 145. The gate dielectric 142 surrounds the gate electrode 141 and is disposed between the gate electrode 141 and the spacers 144, and the gate dielectric 142 is also disposed between the gate electrode 141 and the fin structures 101. The hard mask 143 is disposed on a top of the gate electrode 141 and between the pair of spacers 142. The pair of spacers 142 is disposed on two lateral sidewalls of the stack of the gate electrode 141 and the hard mask 143. The dielectric material 145 is disposed on two lateral sidewalls of the stack of the gate electrode 141, the hard mask 143 and the pair of spacers 144. Detailed configurations of the gate structure 14 are not limited herein.

Figure 3:
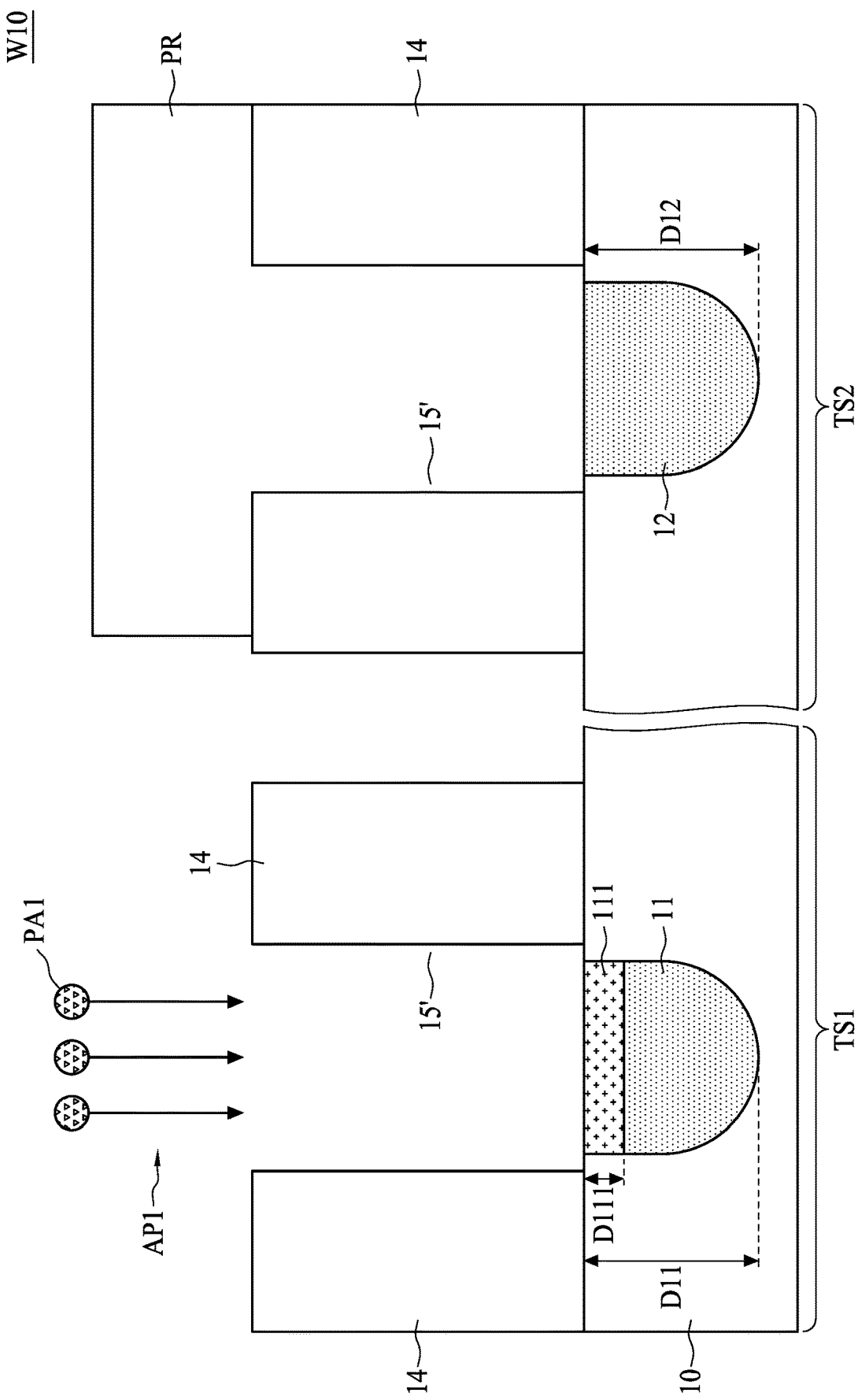
Figure 4:
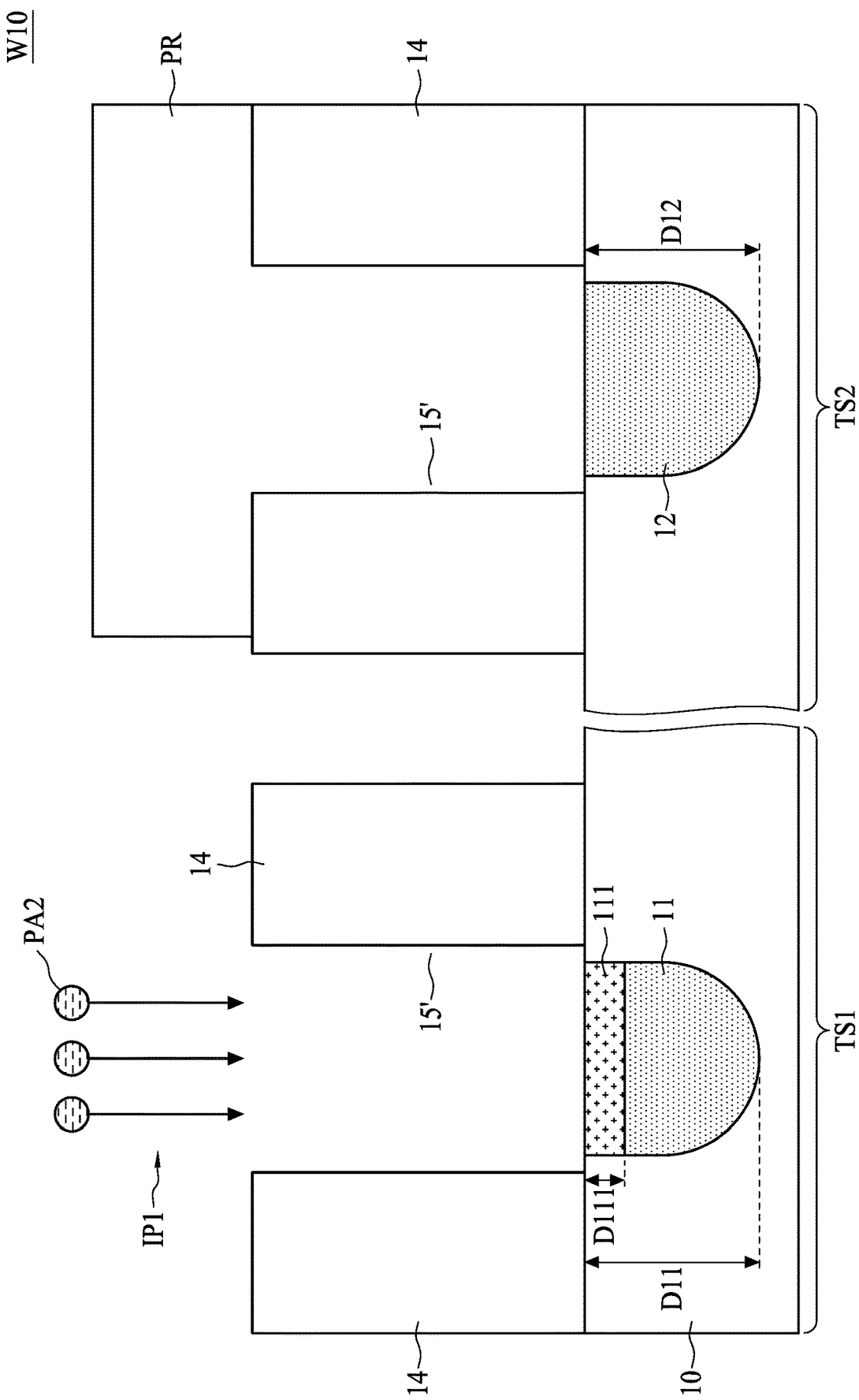

Referring to FIGS. 3 to 4, in accordance with some embodiments of the present disclosure, the method M10 further includes performing an amorphization AP1 and an implantation IP1 on the first conductive region 11 of the first transistor TS1 prior to the operation O13. The amorphization AP1 is to define a vertical dopant profile in the first conductive region 11, and the implantation IP1 is to introduce a substance PA2, or dopants, into the first conductive region 11 of the first transistor TS1. In some embodiments as shown in FIGS. 3 to 4, a photoresist PR is formed over the second transistor TS2 prior to the amorphization AP1 and the implantation IP1. The photoresist PR covers and protects the second conductive region 12 from the first amorphization AP1 and the implantation IP1.

As shown in FIG. 3, the amorphization AP1 causes damage to crystal lattices of the first conductive region 11 to form a first amorphous structure 111 in the first conductive region 11. Crystal defects and dislocation densities of the first conductive region 11 are increased, and a surface portion of the first conductive region 11 is particularly impacted by a first substance PA1 upon the amorphization AP1. The first amorphous structure 111 is formed in the first conductive region 11 by transforming a portion of the crystalline structure of the first conductive region 11 into amorphous form due to damage of crystal lattice by the amorphization AP1. It should be noted that an increase in the amorphous densities of the first conductive region 11 is mostly concentrated in the first amorphous structure 111.

In some embodiments, the amorphization AP1 includes one or more implantations with non-doping ion species being the first substance PA1 to the exposed first conductive region 11. The first substance PA1 is selected from elements or ions that do not alter chemical or conductive properties of the first conductive region 11. In some embodiments, the first substance PA1 is selected from elements included in the first conductive region 11, or inert atoms. In some embodiments, the first substance PA1 is selected from one or more elements in the group IVA and VIIIA on the periodic table. In some embodiments, the first substance PA1 is selected from one or more elements in the group of germanium and silicon. In some embodiments, the first substance PA1 includes one or more noble gases, e.g. argon, helium, and/or the like. For better amorphization result, argon has precedence over helium due to argon's larger atomic size.

During the amorphization AP1, process parameters (such as operation energy, ions/atoms concentration or an ion beam current) are adjusted to obtain sufficient lattice damage in the first conductive region 11. The amorphization AP1 functions to establish desired vertical dopant profiles adjacent to the channel region of the first transistor TS1. The lattice damage in the first conductive region 11 can reduce channeling effects during the subsequent ion implantation IP1. In some embodiments, the amorphization AP1 includes performing an implantation with germanium (i.e. germanium being the first substance PA1). In some embodiments, an ion energy of the implantation is in a range of 3 keV to 10 keV, and a germanium concentration is in a range of 4E14 atom/cm$^2$ to 5E13 atom/cm$^2$. In some embodiments, a depth D11 of the first conductive region 11 is in a range of 40-60 nanometers, and a depth D111 of the first amorphous structure 111 formed by the amorphization AP1 is in a range of 5-10 nanometers. The depth D11 and the depth D111 are measured from the surface exposed from the gate structures 14 and extended vertically down to the bottom of the conductive region 11 in the substrate 10. The depth D111 of the first amorphous structure 111 can be controlled by the ion energy and ion concentration of the implantation IP1.

As illustrated above, the amorphization AP1 functions to impact the first conductive region 11 with the first substance PA1 as shown in FIG. 3. Crystalline densities of the first conductive region 11, and particularly the crystalline densities of the surface portion (i.e. the first amorphous structure 111 in FIG. 3) of the first conductive region 11, are decreased by the amorphization AP1. The surface portion referred to herein are relative to a portion that is proximal to a surface of the first conductive region 11, adjacent to the gate structures 14 and exposed from the gate structures 14. In other words, the amorphization AP1 functions to increase an amorphous density of the first conductive region 11, especially the surface portion of the first conductive region 11.

In some embodiments, the first transistor TS1 is a PMOS transistor, and the implantation IP1 is for a purpose of ion doping into the source/drain region of the first transistor TS1. In some embodiments as shown in FIG. 4, the second substance PA2 is implanted or introduced into the first conductive region 11, especially into the first amorphous structure 111 of the first conductive region 11 due to grain boundary barriers between the crystalline lattice and the first amorphous structure 111. In some embodiments, the second substance PA2 includes boron. In some embodiments, the resulting crystalline density of the first conductive region 11 by the amorphization AP1 can be further reduced by the implantation IP1. In some embodiments, the resulting amorphous density of the first conductive region 11 by the amorphization AP1 can be further increased by the implantation IP1.

In some embodiments, the source/drain region of the first transistor TS1 is formed by epitaxial growth of silicon germanium (SiGe) of the first conductive region 11 and implantation IP1 to introduce the substance PA2, or dopants, into the first conductive region 11. In some embodiments, the second transistor TS2 is an NMOS transistor, and the source/drain region of the second transistor TS2 is formed by epitaxial growth of silicon phosphorus (SiP) of the second conductive region 12, and no extra implantation or doping operation is required. However, it is not intended to limit the present disclosure. Another implantation can be performed to dope the second transistor TS2 in other applications while the first transistor TS1 is protected by a mask. The photoresist PR is removed after the implantation IP1.

Figure 5:
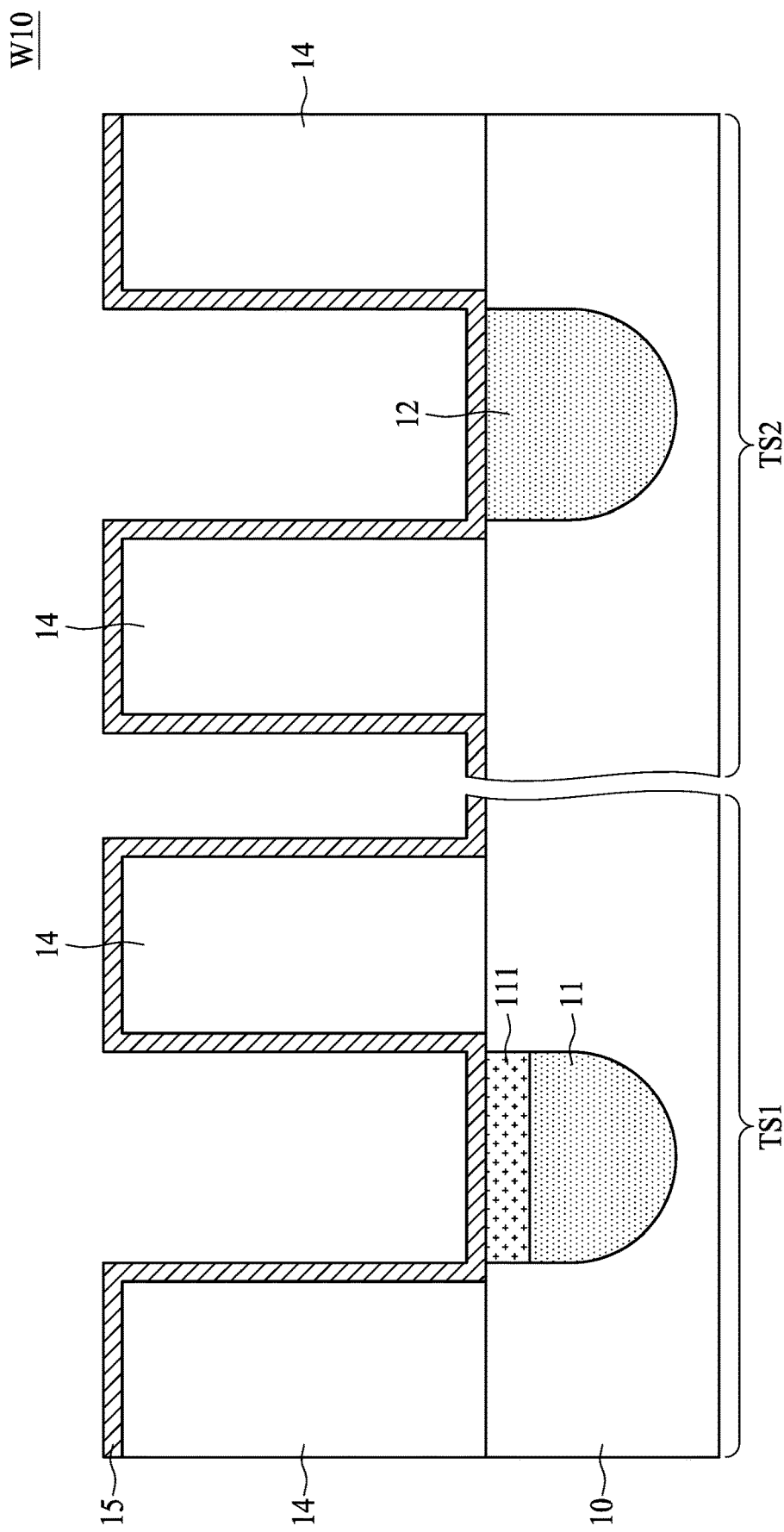

Referring to FIG. 5, in accordance with some embodiments of the present disclosure, the method M10 further includes forming a dielectric layer 15 linearly and conformally over the substrate 10 and the gate structures 14. In some embodiments, spacers of the gate structures 14 (e.g. the spacers 145 shown in FIG. 14) are consumed during the manufacturing process, and a thickness of the spacers are reduced. In some embodiments, a deposition operation is performed to form the dielectric layer 15 over the gate structures 14 to compensate the consumed spacers of the gate structures 14. In some embodiments, the dielectric layer 15 is also formed over the first conductive region 11 and the second conductive region 12. The dielectric layer 15 has a profile conformal to a profile of the substrate 10 and the gate structures 14. In some embodiments, the dielectric layer 15 includes silicon dioxide (SiO$_a$), silicon nitride (Si$_a$N$_b$), boron nitride (BN), germanium nitride (GeN), silicon carbonitride (SiCN), silicon oxycarbonitride (SiOCN), silicon oxynitride (SiON), silicon oxycarbide (SiOC), or a combination thereof, wherein "a" and "b" are integers. In some embodiments, the dielectric layer 15 is made of the same material(s) of the spacers of the gate structures 14. In some embodiments, the dielectric layer 15 is formed by conformal deposition.

For ease of understanding, in the following description, a first side W10$a$ of the semiconductor structure W10 over which the gate structures 14 are disposed is referred to as a "front side," and a second side W10$b$ of the semiconductor structure W10 opposite to the first side W10$a$ of the semiconductor structure W10 is referred to as a "back side". In some embodiments, the first surface 10$a$ of the substrate 10 proximal to or facing to the first side W10$a$ of the semiconductor structure W10 is referred to as a "front surface". In some embodiments, a second surface 10$b$ of the substrate 10 opposite to the first surface 10$a$ of the substrate 10 is referred to as a "back surface".

Figure 6:
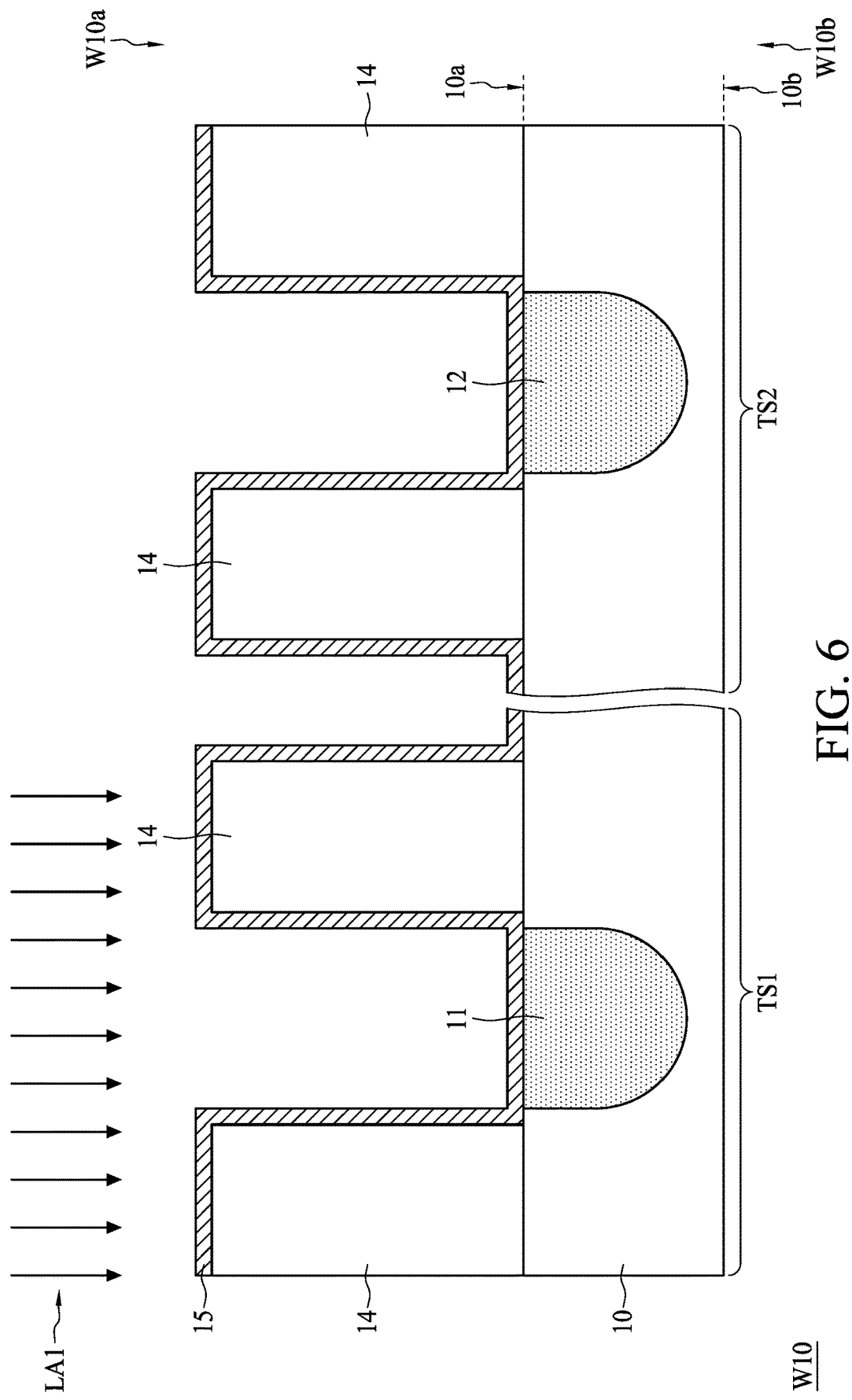

Referring to FIG. 6, in accordance with the operations O12 and some embodiments of the present disclosure, a first laser anneal LA1 is performed on the first conductive region 11 to crystallize the first amorphous structure 111. In some embodiments, the first laser anneal LA1 of the operation O12 is performed from over the gate structures 14 and the first surface 10$a$ of the substrate 10 toward the first conductive region 11. In some embodiments, a duration of the first laser anneal LA1 is in a scale of microseconds. In some embodiments, the duration of the first laser anneal LA1 is in a range from 200 to 400 microseconds. In some embodiments, a temperature of the first laser anneal LA1 is in a range from 800 to 950 degrees Celsius. In some embodiments, the first laser anneal LA1 is targeted to the entire substrate 10 and performed on both the first and the second conductive regions 11 and 12 from the front side W10$a$, which the gate structures 14 and the first and second conductive regions 11 and 12 are exposed to, of the semiconductor structure W10. In some embodiments, the first laser anneal LA1 is performed only on the first transistor TS1. In some embodiments, the first laser anneal LA1 includes laser spike anneal (LSA), dynamic surface anneal (DSA), melt laser anneal (MLA), ultra sub-second anneal (uSSA), or other suitable laser anneal technique. In some embodiments, the first laser anneal LA1 functions to heat the substrate 10 in the process chamber from the front side W10a of the semiconductor structure W10 or the first surface 10a of the substrate 10 by laser beams.

The first laser anneal LA1 provides energy directly onto the first conductive region 11 or the substrate 10. In some embodiments, the first laser anneal LA1 is to provide energy to the first conductive region 11 for crystallization in order to refine the grain structure of the first conductive region 11, especially the first amorphous structure 111 of the first conductive region 11. The first amorphous structure 111 is crystallized from amorphous form into polycrystalline. In some embodiments, laser beams of the first laser anneal LA1 is projected directly onto the first surface 10a of the substrate 10, in a way of discrete lines (instead of broad spectrum). In some embodiments, the first laser anneal LA1 is to provide energy onto a part of the first surface 10a of the substrate 10. In some embodiments, the first laser anneal LA1 is to project laser beams by a laser projector in a way of point scanning or line scanning.

In some embodiments, the polycrystalline formed from the first amorphous structure 111 by the first laser anneal LA1 has a different grain structure from that of the original grain structure of the first conductive region 11 (e.g. the grain structure from epitaxial growth). The grain structure of the polycrystalline formed from the first amorphous structure 111 depends on a degree of the crystallization and the grain growth. For ease of illustration, the figures only show an integral structure of the first conductive region 11, and thus do not show different portions of the first conductive region 11 in different grain structures after the first laser anneal LA1.

Figure 7:
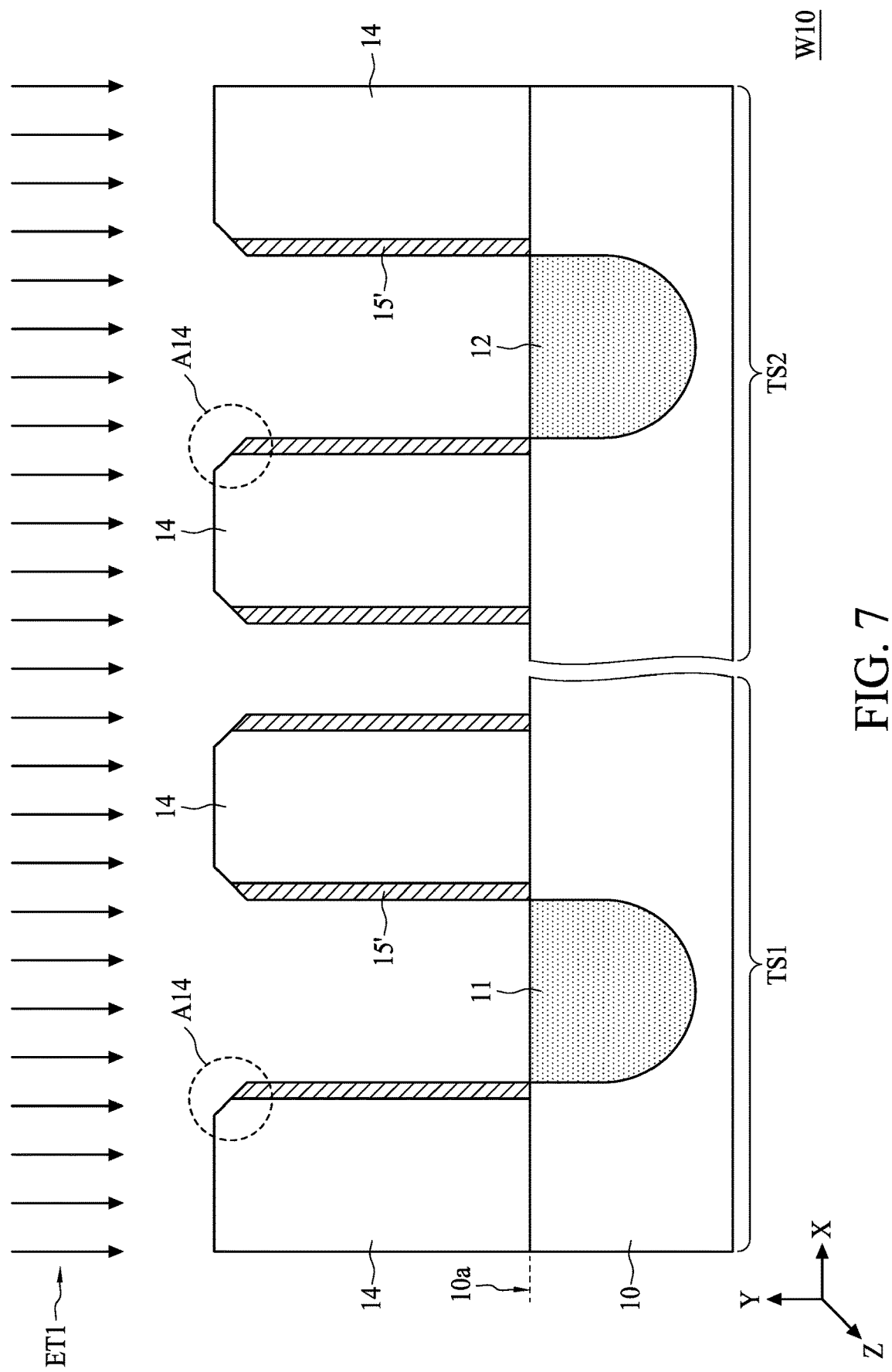

Referring to FIG. 7, in accordance with some embodiments of the present disclosure, the method M10 further includes performing an etching operation ET1 to remove portions of the dielectric layer 15 to form sidewalls 15' remained on two lateral sidewalls of each of the gate structures 14. As illustrated in FIG. 5 above, in some embodiments, the first conductive region 11 and the second conductive region 12 are covered by the dielectric layer 15, and a purpose of the etching operation ET1 is to expose the first and second conductive regions 11 and 12 for the following silicide formation. In some embodiments, the etching operation ET1 is a directional dry etch applied over the substrate 10 and the gate structures 14. In some embodiments, the directional dry etch includes a vertical (vertically towards the first surface 10a of the substrate 10) anisotropic reactive ion etch (RIE) (e.g. performed along the Y direction towards the substrate 10, which is orthogonal to the X-Z plane) targeted to remove horizontal portions (the portions extending parallel to the first surface 10a of the substrate 10) of the dielectric layer 15. Portions of the dielectric layer 15 over the first conductive region 11 and the second conductive region 12 are removed. In some embodiments, portions of the dielectric layer 15 on tops of the gate structures 14 are also removed. The first conductive region 11 and the second conductive region 12 are exposed. In some embodiments, portions of corners A14 of the gate structure 14 are removed by the etching operation ET1 as shown in FIG. 7. In some embodiments, the corners A14 are oblique corners as shown in FIG. 7 after the etching operation ET1. In some embodiments, the corners A14 are rounded corners (not shown) after the etching operation ET1.

In some embodiments, the first laser anneal LA1 is performed prior to the formation of the dielectric layer 15 and after the implantation IP1. In some embodiments, the first laser anneal LA1 is performed after the formation of the dielectric layer 15 and prior to the etching operation ET1. In some embodiments, the first laser anneal LA1 is performed after the formation of the sidewalls 15'. In some embodiments, the first laser anneal LA1 is performed immediately after the implantation IP1.

Figure 8:
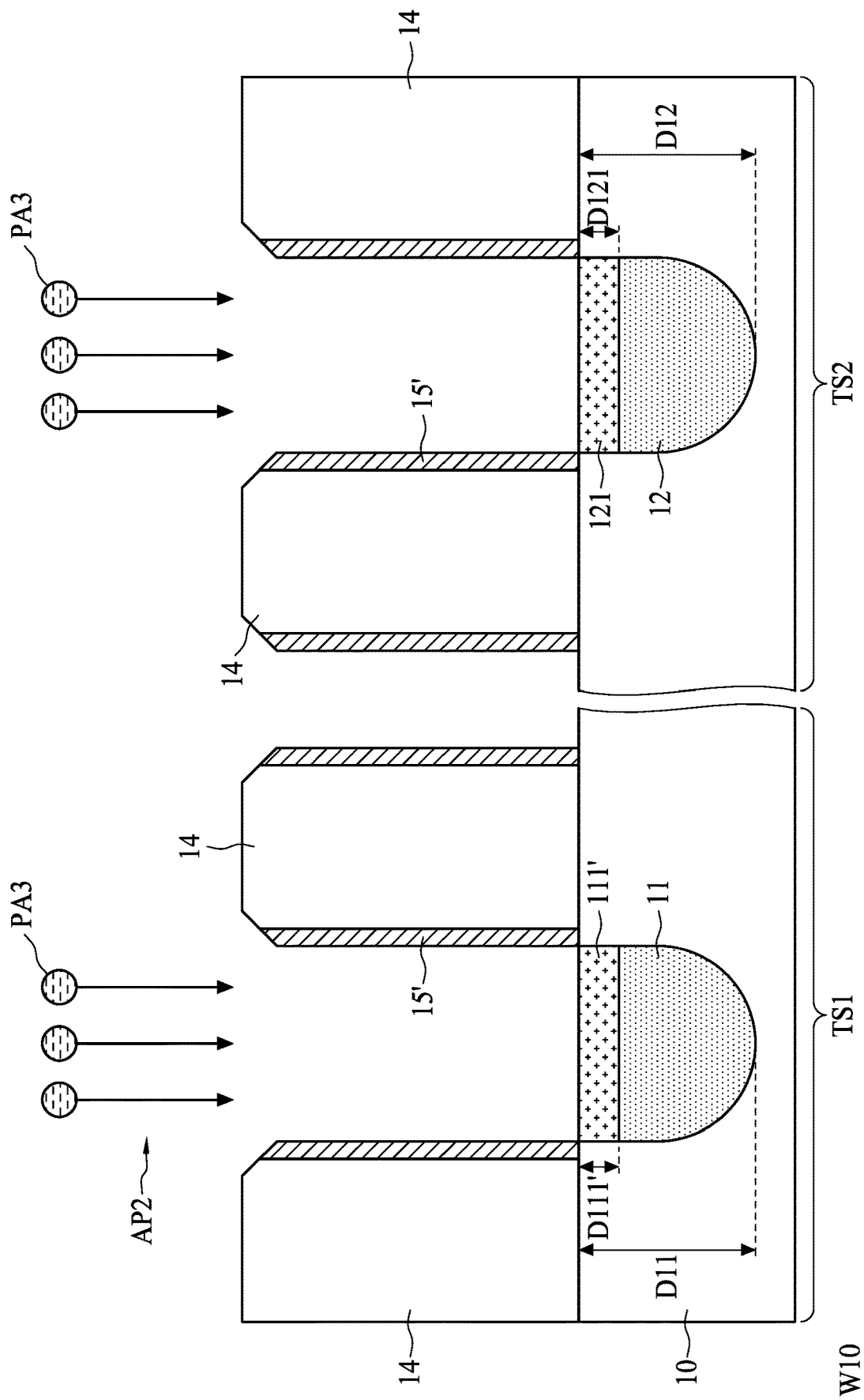

Referring to FIG. 8, in accordance with the operation O13 and some embodiments of the present disclosure, an amorphization AP2 is performed on the first conductive region 11 and the second conductive region 12. The amorphization AP2 causes damage to crystal lattices of both the first conductive region 11 and the second conductive region 12. Crystal defects and dislocation densities of the first and second conductive regions 11 and 12 are increased. Portions of the first and second conductive regions 11 and 12 are particularly impacted by a third substance PA3 upon the amorphization AP2. A second amorphous structure 111' is formed in the first conductive region 11 by transforming a portion of the polycrystalline structure of the first conductive region 11 into amorphous form. A third amorphous structure 121 is formed in the second conductive region 12 by transforming a portion of the crystalline structure of the second conductive region 12 into amorphous form.

In some embodiments, the lattice damage in the first and second conductive regions 11 and 12 by the amorphization AP2 is to enhance silicide formation to a desired phase transformation of a silicide layer formed in the subsequent operations. The amorphization AP2 has similar properties and parameters to the amorphization APE and repeated description is omitted herein for a purpose of the brevity but not intended to limit the present disclosure. The third substance PA3 has similar functions and properties to the first substance PAL In some embodiments, the third substance PA3 is the same as the first substance PAL In some embodiments, the third substance PA3 is different from the first substance PAL In some embodiments, a depth D11 of the first conductive region 11 is in a range of 40-60 nanometers, and a depth D121 of the third amorphous structure 121 formed by the amorphization AP2 is in a range of 5-10 nanometers. In some embodiments, a depth D111' of the second amorphous structure 111 is in a range of 5 to 15 nanometers. In some embodiments, the D111' of the second amorphous structure 111 is greater than the depth D121 of the third amorphous structure 121. The first conductive region 11 has received one more amorphization than the second conductive region 12, and a grain structure of the refined first conductive region 11 by the first laser anneal LA1 can be less compact than a grain structure of epitaxial growth of the second conductive region 12. The depth D111' and the depth D121 are measured from the first surface 10a exposed from the gate structures 14 and extended vertically down to the bottom of the conductive regions 11 and 12 in the substrate 10. The depth D111' of the second amorphous structure 111' and the depth D121 of the third amorphous structure 121 can be controlled by the ion energy and ion concentration of the amorphization AP2.

Figure 9:
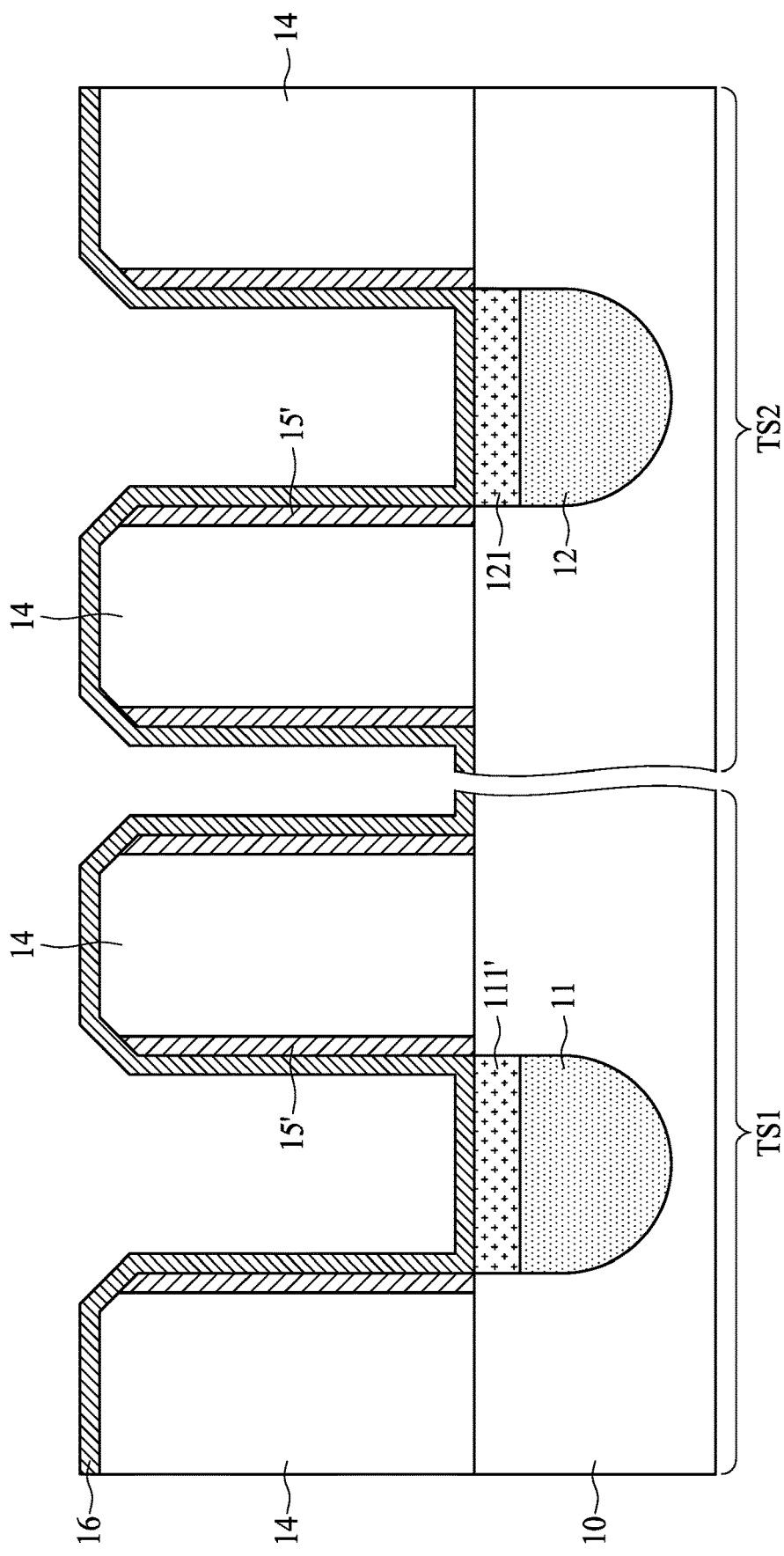

Referring to FIG. 9, in accordance with the operation O14 and some embodiments of the present disclosure, a pre-silicide layer 16 is formed over the first conductive region 11 and the second conductive region 12 on the substrate 10. In some embodiments, the pre-silicide layer 16 is conformally formed over the substrate 10 and physically contacts the second amorphous structure 111' of the first conductive region 11 and the third amorphous structure 121 of the second conductive region 12. The pre-silicide layer 16 has a profile conformal to a profile of the conductive regions 11 and 12 and the gate structures 14. In some embodiments, the pre-silicide layer 16 includes titanium (Ti), tantalum (Ta), erbium (Er), yttrium (Y), ytterbium (Yb), europium (Eu), terbium (Tb), lutetium (Lu), thorium (Th), scandium (Sc), hafnium (Hf), zirconium (Zr), terbium (Tb), chromium (Cr), niobium (Nb), ruthenium (Ru), cobalt (Co), nickel (Ni), platinum (Pt), tungsten (W), other suitable metals, compounds containing above metal (e.g. nitride compounds containing the listed metal), or a combination thereof. In some embodiments, the pre-silicide layer 16 is a multi-layered structure. In some embodiments, the pre-silicide layer 16 includes a titanium (Ti) sub-layer and a titanium nitride (TiN) sub-layer sequentially thereon (not shown in the figures). In some embodiments, the pre-silicide layer 16 is formed by conformal deposition, chemical vapor deposition (CVD), physical vapor deposition (PVD) or any other suitable operations.

Figure 10:
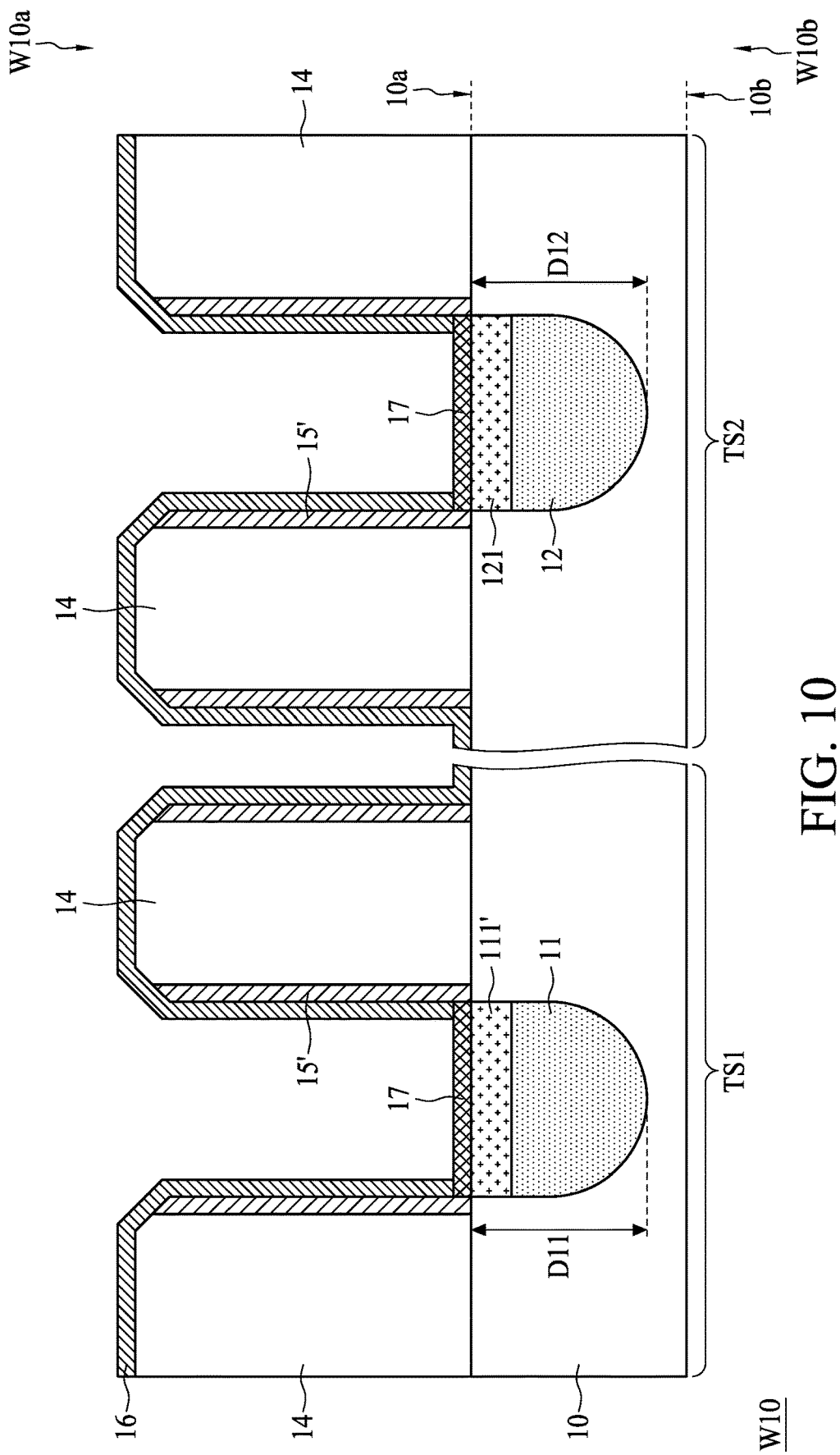

Referring to FIG. 10, in accordance with the operation O15 and some embodiments of the present disclosure, a thermal anneal is performed on the first conductive region 11, the second conductive region 12 and the substrate 10, thereby forming a silicide layer 17 from at least a portion of the pre-silicide layer 16 on the first conductive region 11 and the second conductive region 12. In some embodiments, the thermal anneal of the operation O15 are performed over the semiconductor structure W10. In some embodiments, the silicide layer 17 contains the metal element of the pre-silicide layer 16. In some embodiments, the silicide layer 17 includes titanium silicide (TiSi).

The thermal anneal in the present disclosure is to provide heat in a way of broad spectrum (instead of discrete lines). In some embodiments, types of the thermal anneal include furnace-based anneal and lamp-based anneal. In some embodiments, the whole substrate 10 or the whole semiconductor structure W10 is heated upon the thermal anneal. In some embodiments, the thermal anneal is to provide heat for the first surface 10a of the substrate 10 or the first side W10a of the semiconductor structure W10. In some embodiments, the thermal anneal is to provide heat for both the first side W10a and the second side W10b of the semiconductor structure W10. In some embodiments, the thermal anneal is to provide heat only for the second side W10b of the semiconductor structure W10 or the second surface 10b of the substrate 10, and the first surface 10a of the substrate 10 or the first side W10a of the semiconductor structure W10 is heated upon by heat conduction.

The thermal anneal provides energy to facilitate reactions between layers. Diffusions, between the first conductive region 11 and a portion of the pre-silicide layer 16 on the first conductive region 11, and between the second conductive region 12 and a portion of the pre-silicide layer 16 on the second conductive region 12, are driven to form the silicide layer 17 on the first and second conductive regions 11 and 12. The silicide layer 17 is formed from portions of the pre-silicide layer 16 contacting the first and second conductive regions 11 and 12 respectively.

In some embodiments, a temperature and a duration of the thermal anneal is controlled in certain ranges to control a thermal budget for designed phase transformation of the silicide layer 17. A phase of lattice of the silicide layer 17 is shifted during the thermal anneal. The designed phase transformation of the silicide layer 17 is not limited herein. A plane orientation of the designed phase transformation of the silicide layer 17 is application dependent. The designed phase transformation is designed to provide a desired resistance of source/drain contacts of a semiconductor device. In some embodiments, the temperature of the thermal anneal is in a range of 500 to 650 degrees Celsius (° C.). In some embodiments, the duration of the thermal anneal is in a scale of seconds. In some embodiments, the duration of the thermal anneal is in a range of 10 to 30 seconds. In some embodiments, the thermal anneal serves to heat the substrate 10 in a process chamber from the first side W10a and the second side W10b of the semiconductor structure W10. In some embodiments, the thermal anneal is a rapid thermal anneal.

Figure 11:
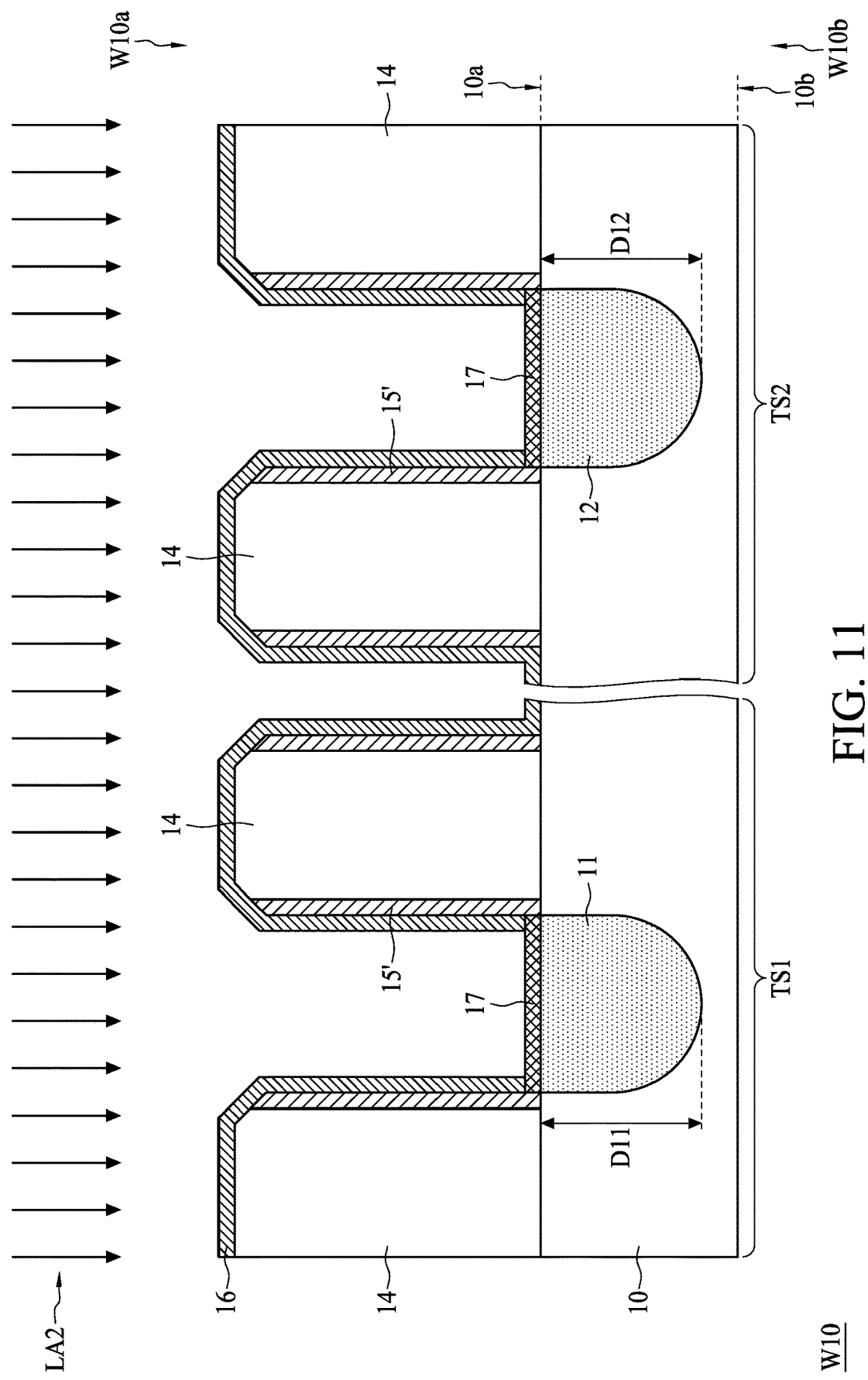

Referring to FIG. 11, in accordance with the operation O16 and some embodiments of the present disclosure to form, a second laser anneal LA2 is performed on the first conductive region 11 and the second conductive region 12, thereby crystallizing the second amorphous structure 111' and the third amorphous structure 121 after the formation of the pre-silicide layer 16. In some embodiments, the second laser anneal LA2 of the operation O16 is performed over the gate structures 14 and the first surface 10a of the substrate 10 toward the first conductive region 11 and the second conductive region 12. In some embodiments, a duration of the second laser anneal LA2 is in a range from 200 to 400 microseconds, and a temperature of the second laser anneal LA2 is in a range from 800 to 950 degrees Celsius. In some embodiments, the second laser anneal LA2 is targeted to the entire substrate 10 and performed on both the first and the second conductive regions 11 and 12 from the front side W10a of the semiconductor structure W10. Other limitations and conditions of the second laser anneal LA2 can be referred to the first laser anneal LA1, and repeated description is omitted herein for a purpose of brevity.

Similar to the first laser anneal LA1, repair of crystal lattices of the second amorphous structure 111' of the first conductive region 11 and the third amorphous structure 121 of the second conductive region 12 are facilitated by the second laser anneal LA2 (the operation O16). The second amorphous structure 111' and the third amorphous structure 121 are crystallized into polycrystalline.

In some embodiments, the polycrystalline formed from the second and third amorphous structure 111' and 121 by the second laser anneal LA2 has different grain structures from the original grain structures of the first conductive region 11 and the second conductive region 12 respectively (e.g. the grain structure from epitaxial growth). The grain structures of the polycrystalline formed from the second amorphous structure 111' and the third amorphous structure 121 depend on parameters of the second laser anneal LA2 and a degree of the crystallization and the grain growth. For ease of illustration, the figures only show an integral structure of the first conductive region 11 and an integral structure of the second conductive region 12. The figures do not show different portions of the first conductive region 11 in different grain structures and different portions of the second conductive region 12 in different grain structures after the second laser anneal LA2.

The first laser anneal LA1 and the second laser anneal LA2 in the present disclosure are to provide energy directly onto the substrate 10 or the semiconductor structure W10. In some embodiments, the first laser anneal LA1 and the second laser anneal LA2 individually are to provide energy onto merely a part of the substrate 10 or a part of the semiconductor structure W10. In some embodiments, only a part of the substrate 10 or a part of the semiconductor structure W10 is heated up by the laser anneal due to short duration of a laser annealing operation. As such, the heat energy provided by the laser anneal operation is not sufficient to conduct to the entire substrate 10 or the entire semiconductor structure W10. In some embodiments, the entire substrate 10 or the entire semiconductor structure W10 is heated up by the thermal anneal more evenly than by the first laser anneal LA1 or the second laser anneal LA2.

In some embodiments, a temperature difference between the first laser anneal LA1 (or the second laser anneal LA2) and the thermal anneal is greater than or equal to 150 degrees Celsius (° C.). In some embodiments, the temperature of the thermal anneal is lower than the temperature of the first laser anneal LA1 (or the second laser anneal LA2). In some embodiments, the duration of the thermal anneal is greater than a duration of the first laser anneal LA1 (or the second laser anneal LA2). In some embodiments, the semiconductor structure W10 is a part of a die, a wafer, a device or a package. In some embodiments, the second laser anneal LA2 is performed after the thermal anneal. In some embodiments, the thermal anneal is performed after the second laser anneal LA2.

In some embodiments, the crystallization of the second amorphous structure 111' and the third amorphous structure 121 are dominated by the second laser anneal LA2 due to higher temperature, and such high temperature of the second laser anneal LA2 can cure lattice defects. In some embodiments, the temperature and the duration of the second laser anneal LA2 is controlled in certain ranges for a purpose of crystal repair. A thermal budget of the second laser anneal LA2 is also controlled to avoid alteration of the designed phase transformation of the silicide layer 17. In some embodiments, a thermal budget of the second laser anneal LA2 is less than a thermal budget of the thermal anneal. In some embodiments, the dopant activation is also achieved by the second laser anneal LA2 (the operation O16).

The formation of the silicide layer 17 can be dominated by the second laser anneal LA2 or the thermal anneal depending on which is performed first. In both circumstances (either the laser anneal or the thermal anneal), the phase transformation is shifted or adjusted. However, it is observed that an electrical resistance uniformity of the silicide layer 17 across a wafer of the thermal anneal-first embodiments tends to be better than that of the laser anneal-first embodiments. In the thermal anneal-first embodiments, the formation of the silicide layer 17 is dominated by the thermal anneal. The thermal anneal provides better thermal uniformity across the wafer than the laser anneal due to longer duration of the thermal anneal. In other words, the laser anneal provides less thermal uniformity across the wafer than the thermal anneal due to the scattering effect of the laser anneal.

The crystalline densities of the first and second conductive regions 11 and 12 upon or after the second laser anneal LA2 of the operation O16 are increased respectively. In other words, the laser anneal in the operation O16 is performed to decrease an amorphous density of the first conductive region 11 as well as an amorphous density of the second conductive region 12 by crystallizing at least a portion of the second amorphous structure 111' and at least a portion of the third amorphous structure 121. It should be noted that crystal structures of the first and second amorphous structures 111 and 121 of the first and second conductive regions 11 and 12 respectively may not be restored to the crystal structures of the first and second conductive regions 11 and 12 prior to the amorphization AP1 and/or the amorphization AP2. However, the operation O16 of the mothed M10 can significantly increase the crystalline densities of the first and second conductive regions 11 and 12.

Figure 12:
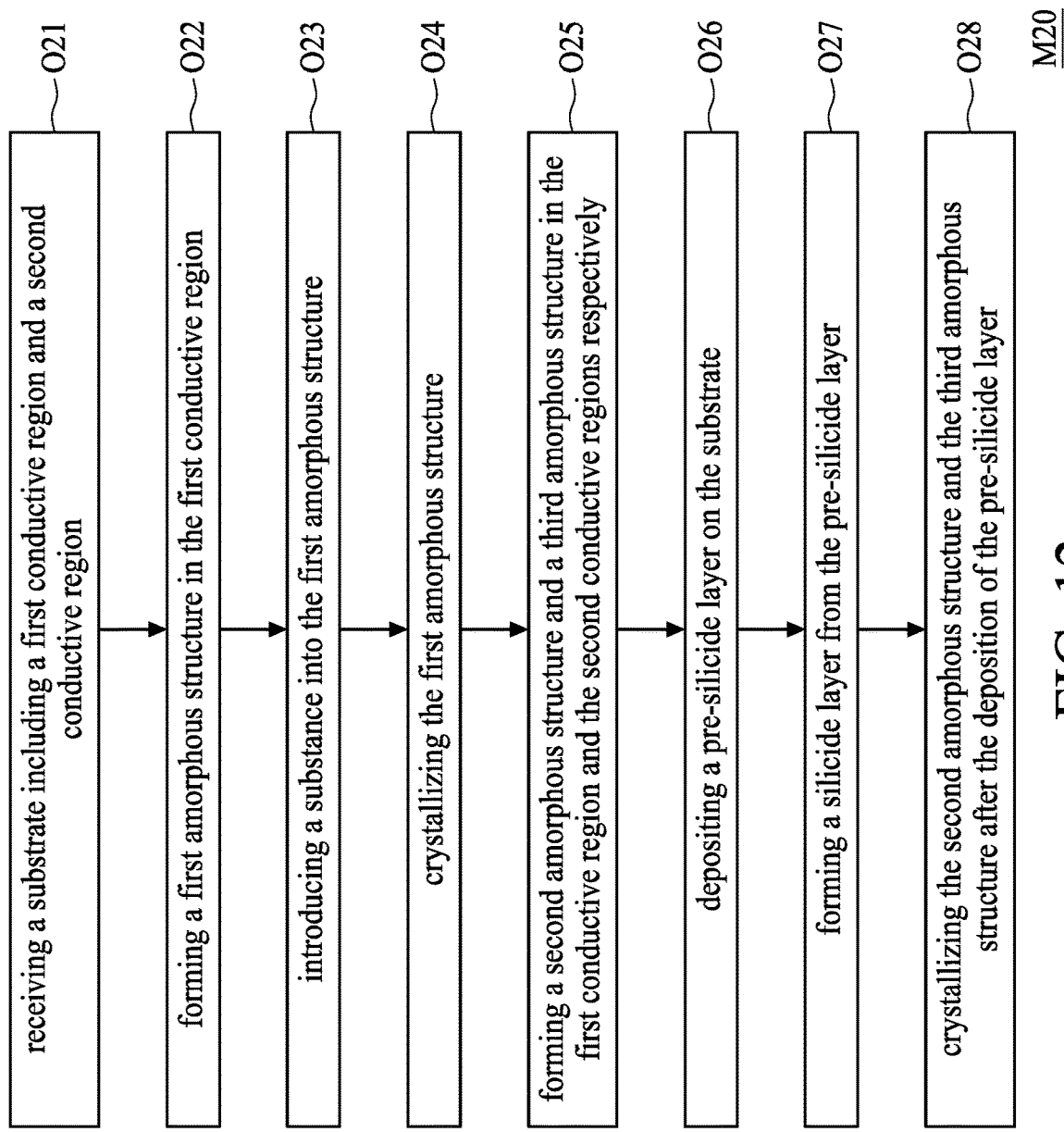
FIG. 12 is a flowchart of a method for manufacturing a semiconductor structure in accordance with some embodiments of the present disclosure.

Under the same concepts, and in addition to the above-illustrated method M10, the present disclosure also provides a method M20 for manufacturing a semiconductor structure similar to the semiconductor structure W10, as shown in FIG. 12. The method M20 includes: (O21) receiving a substrate including a first conductive region and a second conductive region; (O22) forming a first amorphous structure in the first conductive region; (O23) implanting a second substance into the first conductive region; (O24) crystallizing the first amorphous structure; (O25) forming a second amorphous structure and a third amorphous structure in the first conductive region and the second conductive regions respectively; (O26) depositing a pre-silicide layer on the substrate; (O27) forming a silicide layer from the pre-silicide layer; and (O28) crystallizing the second amorphous structure and the third amorphous structure after the deposition of the pre-silicide layer.

Figure 13:
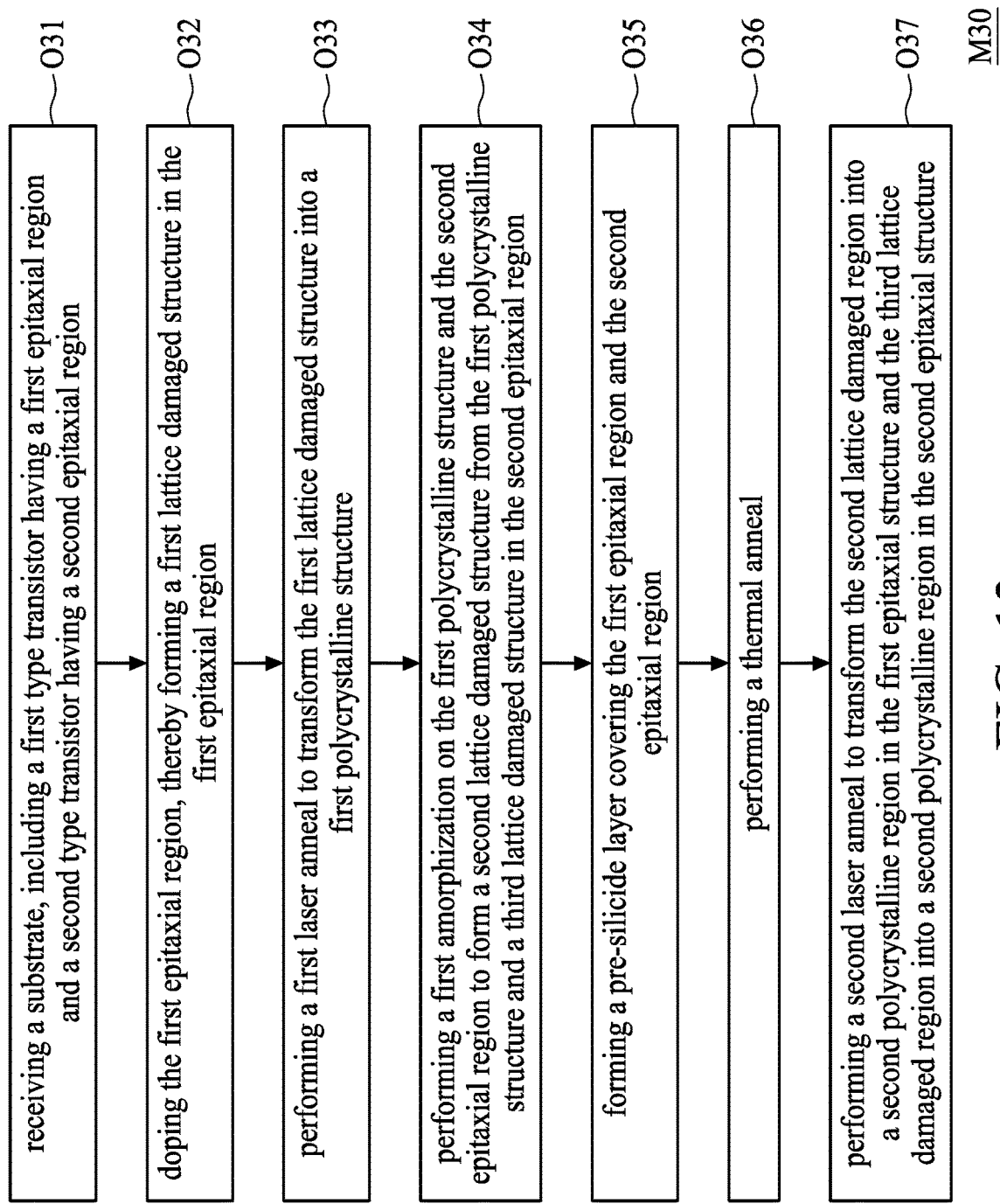
FIG. 13 is a flowchart of a method for manufacturing a semiconductor structure in accordance with some embodiments of the present disclosure.

Still under the same concept, for some embodiments having epitaxial growth of the conductive regions 11 and 12, the present disclosure also provides a method M30 for manufacturing a semiconductor structure similar to the semiconductor structure W10, as shown in FIG. 13. The method M30 includes: (O31) receiving a substrate, including a first type transistor having a first epitaxial region and a second type transistor having a second epitaxial region; (O32) doping the first epitaxial region, thereby forming a first lattice damaged structure in the first epitaxial region; (O33) performing a first laser anneal to transform the first lattice damaged structure into a first polycrystalline structure; (O34) performing a first amorphization on the first polycrystalline structure and the second epitaxial region to form a second lattice damaged structure from the first polycrystalline structure and a third lattice damaged structure in the second epitaxial region; (O35) forming a pre-silicide layer covering the first epitaxial region and the second epitaxial region; (O36) performing a thermal anneal; and (O37) performing a second laser anneal to transform the second lattice damaged region into a second polycrystalline region in the first epitaxial structure and the third lattice damaged region into a second polycrystalline region in the second epitaxial structure.

Some embodiments of the present disclosure provide a method for manufacturing a semiconductor structure. The method includes: receiving a substrate including a first transistor with a first conductive region and a second transistor with a second conductive region, wherein the first transistor and the second transistor have different conductive types; performing a first laser anneal on the first conductive region; performing an amorphization on the first conductive region and the second conductive region; forming a pre-silicide layer on the substrate; performing a thermal anneal to the substrate to form a silicide layer; and performing a second laser anneal on the first conductive region and the second conductive region after the formation of the pre-silicide layer.

Some embodiments of the present disclosure provide a method for manufacturing a semiconductor structure. The method includes: receiving a substrate including a first conductive region and a second conductive region; forming a first amorphous structure in the first conductive region; implanting a second substance into the first conductive region; crystallizing the first amorphous structure; forming a second amorphous structure and a third amorphous structure in the first conductive region and the second conductive regions respectively; depositing a pre-silicide layer on the substrate; forming a silicide layer from the pre-silicide layer; and crystallizing the second amorphous structure and the third amorphous structure after the deposition of the pre-silicide layer.

Some embodiments of the present disclosure provide a method for manufacturing a semiconductor structure. The method includes: receiving a substrate, including a first type transistor having a first epitaxial region and a second type transistor having a second epitaxial region; doping the first epitaxial region, thereby forming a first lattice damaged structure in the first epitaxial region; performing a first laser anneal to transform the first lattice damaged structure into a first polycrystalline structure; performing a first amorphization on the first polycrystalline structure and the second epitaxial region to form a second lattice damaged structure from the first polycrystalline structure and a third lattice damaged structure in the second epitaxial region; forming a pre-silicide layer covering the first epitaxial region and the second epitaxial region; performing a thermal anneal; and performing a second laser anneal to transform the second lattice damaged region into a second polycrystalline region in the first epitaxial structure and the third lattice damaged region into a second polycrystalline region in the second epitaxial structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    receiving a substrate including a first transistor with a first conductive region and a second transistor with a second conductive region, wherein the first transistor and the second transistor have different conductive types;
    performing a first laser anneal on the first conductive region;
    performing a first amorphization on the first conductive region and the second conductive region;
    forming a pre-silicide layer on the substrate;
    performing a thermal anneal to the substrate to form a silicide layer; and
    performing a second laser anneal on the first conductive region and the second conductive region after the formation of the pre-silicide layer,
    wherein the first amorphization is performed after the first laser anneal.

2. The method of claim 1, wherein the first laser anneal and the second laser anneal are within micro-seconds respectively.

3. The method of claim 1, wherein the thermal anneal is a rapid thermal annealing, and a duration of the thermal anneal is in a range of 10-30 seconds.

4. The method of claim 1, wherein the performance of the first laser anneal includes refining a grain structure of the first conductive region.

5. The method of claim 1, wherein the first conductive region and the second conductive region are covered by a dielectric layer during the first laser anneal.

6. The method of claim 1, wherein the second laser anneal is performed after the formation of the silicide layer.

7. The method of claim 1, wherein the thermal anneal is performed after the second laser anneal.

8. The method of claim 1, wherein the second laser anneal is performed after the thermal anneal.

9. The method of claim 1, wherein a duration of the first laser anneal is in a range from 200 to 400 microseconds, and a temperature of the first laser anneal is in a range from 800 to 950 degrees Celsius.

10. The method of claim 1, wherein the first amorphization includes implantation with elements selected from: germanium, silicon, argon, or any combination thereof.

11. The method of claim 1, wherein a temperature of the thermal anneal is in a range from 500 to 650 degrees Celsius.

12. The method of claim 1, wherein the silicide layer is formed in a designed phase transformation by the thermal anneal.

13. The method of claim 1, wherein a duration of the second laser anneal is in a range from 200 to 400 microseconds, and a temperature of the second laser anneal is in a range from 800 to 950 degrees Celsius.

14. The method of claim 1, wherein the first conductive region and the second conductive region include epitaxial regions.

15. The method of claim 1, wherein the substrate further comprises a first amorphous structure in the first conductive region.

16. The method of claim 15, wherein the first amorphous structure includes boron.

17. The method of claim 15, wherein the performing the first laser anneal on the first conductive region comprises crystallizing the first amorphous structure.

18. The method of claim 15, wherein the first amorphous structure is a lattice damaged structure.

19. The method of claim 18, wherein ions are introduced into the lattice damaged structure by implantation.

20. The method of claim 1, wherein the performing the first amorphization on the first conductive region and the second conductive region comprises forming a second amorphous structure and a third amorphous structure in the first conductive region and the second conductive regions, respectively.

* * * * *